United States Patent [19]

Nose et al.

[11] Patent Number: 5,313,272
[45] Date of Patent: May 17, 1994

[54] METHOD AND APPARATUS FOR MEASURING DEVIATION BETWEEN PATTERNS ON A SEMICONDUCTOR WAFER

[75] Inventors: Noriyuki Nose, Atsugi; Kenji Saitoh; Hiroshi Osawa, both of Yokohama; Masanobu Hasegawa, Fujisawa, all of Japan

[73] Assignee: Canon Kabushiki Kaisha, Tokyo, Japan

[21] Appl. No.: 923,500

[22] Filed: Aug. 3, 1992

[30] Foreign Application Priority Data

Aug. 5, 1991 [JP] Japan .................. 3-219241

[51] Int. Cl.$^5$ .................................. G01B 11/00
[52] U.S. Cl. ........................ 356/375; 356/401; 250/548; 355/53
[58] Field of Search .......... 356/373, 375, 399, 400, 356/401; 250/548; 355/53

[56] References Cited

U.S. PATENT DOCUMENTS

| | | | |
|---|---|---|---|
| 4,962,423 | 10/1990 | Yamada et al. | |
| 5,028,797 | 7/1991 | Abe et al. | 250/548 |
| 5,114,236 | 5/1992 | Matsugu et al. | 356/401 |
| 5,142,156 | 8/1992 | Ozawa et al. | 250/548 |
| 5,148,037 | 9/1992 | Suda et al. | 250/548 |
| 5,216,257 | 1/1993 | Brueck et al. | 356/401 |

FOREIGN PATENT DOCUMENTS 0409573 1/1991 European Pat. Off. .
WO8604158 7/1986 PCT Int'l Appl. .

OTHER PUBLICATIONS

IBM Technical Disclosure Bulletin, vol. 13, No. 4, "Aligning and Inspecting Microelectronic Circuits", J. S. Harper, et al., Sep. 1970.
Patent Abstracts of Japan, Abstract of Japanese No. JP-A-62 086 725, vol. 11, No. 286, Publication Date: Sep. 16, 1987.

*Primary Examiner*—F. L. Evans
*Attorney, Agent, or Firm*—Fitzpatrick, Cella, Harper & Scinto

[57] ABSTRACT

A method and apparatus for measuring the deviation between elements on an object includes the steps of and devices for performing the steps of forming at least a first physicooptical element on the object: forming at least a second physicooptical element on the object, the first and second physicooptical elements having lens functions; projecting light beams onto the first and second physicooptical elements on the object and detecting the incident positions of light beams travelling from the first and second physicooptical elements, having been subjected to the lens functions of the first and second physicooptical elements, on a predetermined surface; and detecting the deviation between the first and second physicooptical elements on the object from the relationship between the detected incident positions of the light beams.

8 Claims, 11 Drawing Sheets

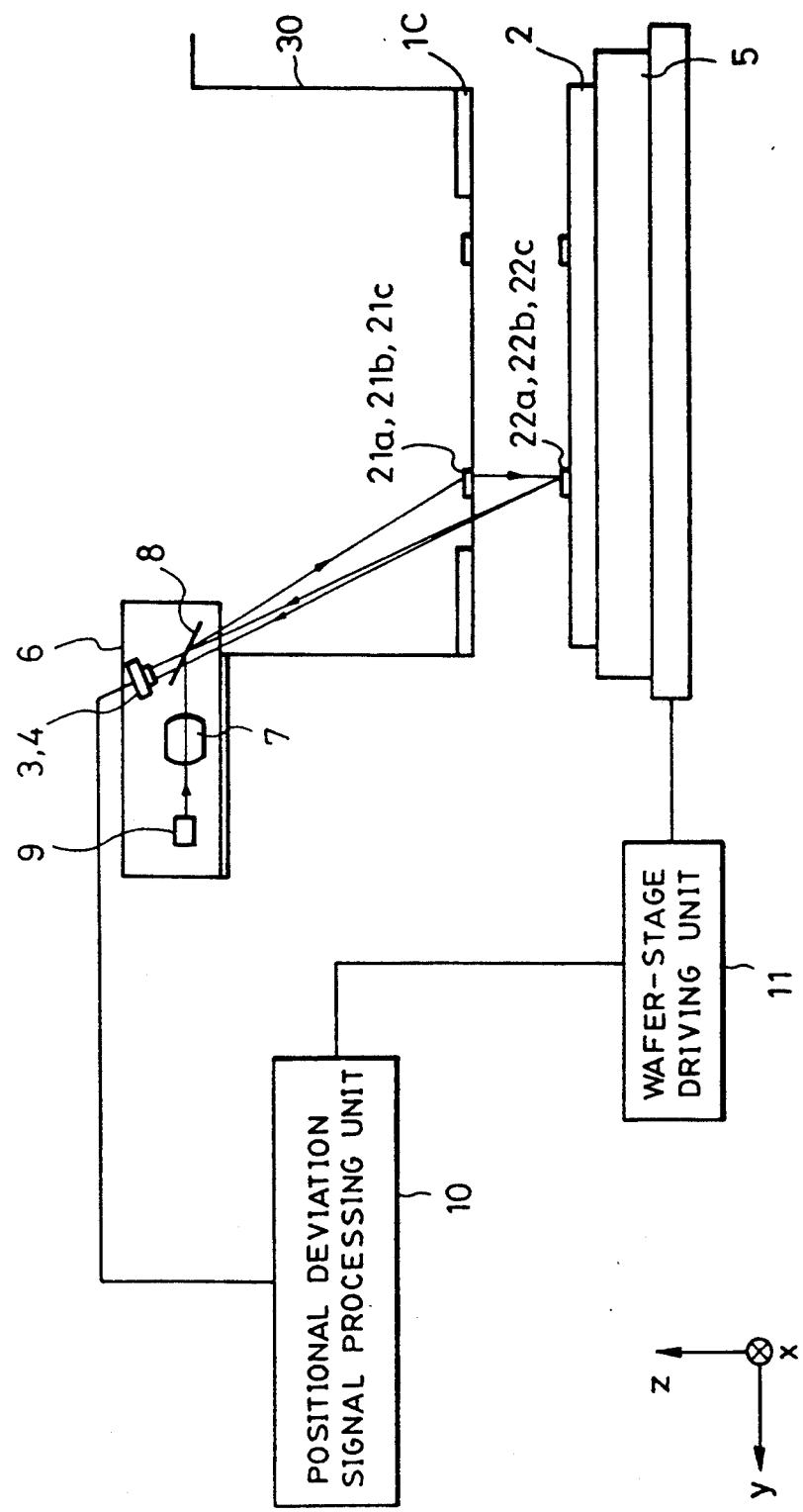

METHOD AND APPARATUS FOR MEASURING DEVIATION BETWEEN PATTERNS ON A SEMICONDUCTOR WAFER

BACKGROUND OF THE INVENTION

1. Field of the Invention

This invention relates to a method for measuring deviation and an apparatus which uses such a method, in which accuracy of alignment is measured when patterns on masks, reticles or the like, are printed in a superposed state while being aligned, for example, by an exposure apparatus for producing semiconductor devices.

2. Description of the Related Art

In a so-called exposure transfer apparatus for producing semiconductor devices for exposing and transferring circuit patterns on a reticle onto a photosensitive member on a wafer using ultraviolet rays, X rays or the like, relative alignment between the reticle and the wafer is one of important factors for improving the performance of semiconductor devices. Particularly, in alignment in recent exposure apparatuses, for example, a submicron alignment accuracy is required for effecting large-scale integration of semiconductor devices.

In many aligning apparatuses, so-called alignment patterns for alignment are provided on a reticle and a wafer, and alignment between the reticle and the wafer is performed utilizing positional information obtained from the alignment patterns. Conventionally, for actually measuring and evaluating the performance of alignment of an apparatus assembled as an exposure apparatus, fine patterns formed on two reticles are aligned and printed in a superposed state on a wafer, and the amount of deviation between the patterns on the wafer is measured visually or by performing image processing.

The above-described visual measurement has problems in that, for example, (1) accuracy in the measurement varies since the measurement greatly depends on the experience and skill of the person who performs the measurement, (2) the measurement takes time and care since the measurement is not automatic, and (3) high accuracy in the measurement cannot be obtained.

The above-described measurement which uses image processing also has problems in that, for example, time is needed because the measurement entails the performing of a complicated procedure, and high accuracy in the measurement cannot be obtained.

SUMMARY OF THE INVENTION

It is an object of the present invention to overcome the problems of the prior art.

It is another object of the present invention to provide a method of measuring the deviation between elements on an object, and an apparatus which uses such a method in which the measuring time can be shortened and a stable high measuring accuracy can be obtained from an automated process.

It is still another object of the present invention to measure the deviation between patterns on a semiconductor wafer caused by poor accuracy in the superposition of the patterns or inaccurate alignment in the apparatus making the wafer.

According to one aspect, the present invention which achieves these objectives relates to a method for measuring deviation between elements on an object, comprising the steps: forming at least a first physicooptical element on the object; forming at least a second physicooptical element on the object; the first and second physicooptical elements having lens functions, projecting light beams onto the first and second physicooptical elements on the object, and detecting the incident positions of two light beams travelling from the first and second physicooptical elements, having been subjected to the lens functions of the first and second physicooptical elements, on a predetermined surface; and detecting the deviation between the first and second physicooptical elements on the object from the relationship between the detected incident positions of the two light beams.

The first physicooptical element forming step can comprise the step of forming a first alignment mark on the object together with the first physicooptical element. In addition, the second physicooptical element forming step can be performed while positional adjustment of the object is performed using the first alignment mark. The method can further comprise the step of detecting the state of the positional adjustment of the object by detecting the deviation between the physicooptical elements in the deviation detection step.

The first physicooptical element forming step can comprise the step of forming first and second alignment marks together with the first physicooptical element. In addition, the second physicooptical element forming step can be performed after preparing a member for forming the second physicooptical element having a second alignment mark thereon. The second physicooptical element forming step can comprise the step of performing positional adjustment of the object using the second and first marks. In addition, the method can further comprise the steps of, after preparing a substrate having a fourth alignment mark and third and fourth physicooptical elements, and performing positional adjustment between the object and the substrate using the fourth and third alignment marks, illuminating the first and second physicooptical elements with the first and second light beams deflected by the third and fourth physicooptical elements, respectively; and detecting incident positions of the light beams travelling from the first and second physicooptical elements while being deflected by the respective elements on a predetermined surface. In addition, the method can further comprise the step of detecting the state of the positional adjustment between the object and the member by detecting the deviation between the physicooptical elements in the deviation detecting step. Moreover, the forming steps can comprise the step of forming a physicooptical element comprising a Fresnel zone plate.

According to another aspect, the present invention which achieves these objectives relates to an apparatus for measuring deviation between elements on an object, comprising: irradiation means for irradiating an object with light beams, the irradiation means irradiating first and second physicooptical elements formed on the object with the light beams, the first and second physicooptical elements having lens functions; detection means for detecting the incident positions of two light beams travelling from the first and second physicooptical elements, having been subjected to the lens functions of the first and second physicooptical elements, on a light-receiving surface; and measurement means for measuring the deviation between the first and second physicooptical elements on the object from the relationship between the detected incident positions of the two light beams.

According to still another aspect, the invention which achieves these objectives relates to an exposure apparatus comprising first holding means for holding an exposure original; second holding means for holding an object to which the exposure original is exposed and from which a pattern is transferred; irradiation means for irradiating an object held by the second holding means with light beams, the irradiation means irradiating first and second physicooptical elements formed on the object with the light beams, the first and second physicooptical elements having lens functions; detection means for detecting incident positions of two light beams travelling from the first and second physicooptical elements, having been subjected to the lens functions of the first and second physicooptical elements, on a light-receiving surface; and measurement means for measuring the deviation between the first and second physicooptical elements on the object from the relationship between the detected incident positions of the two light beams.

The foregoing and other objects, advantages and features of the present invention will become more apparent from the following description of the preferred embodiments taken in conjunction with the accompanying drawings.

BRIEF DESCRIPTION OF THE DRAWINGS

FIG. 7 is a diagram showing the configuration of the exposure apparatus;

DESCRIPTION OF THE PREFERRED EMBODIMENTS

Embodiments of the present invention will now be explained in detail with reference to FIGS. 1 through 14.

Figure 1:
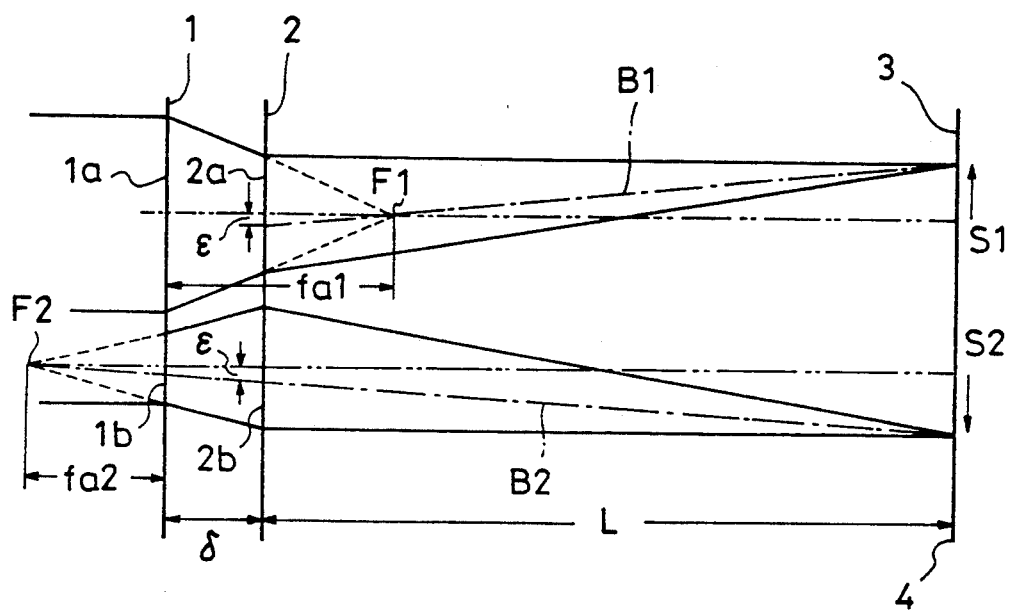
FIG. 1 is a diagram illustrating the principle of a method of detecting deviation between a mask and a wafer according to the present invention.

First, an explanation will be provided of a method of detecting the positional deviation between a mask having printing patterns and a wafer according to a first embodiment of the present invention. FIG. 1 is a diagram illustrating the principle of a method of detecting the positional deviation between a mask 1, serving as a first object, and a wafer 2, serving as a second object, from the interval between light spots obtained by patterns, each of which comprises a zone plate having the same function as a diffraction lens, provided on the mask 1 and the wafer 2. Alignment patterns 1a and 2a for obtaining a first signal light beam B1, and alignment patterns 1b and 2b for obtaining a second signal light beam B2 are provided on the mask 1 and the wafer 2, respectively. Each of the alignment patterns 1a, 1b, 2a and 2b has the function of a diffractive physicooptical element, comprising, for example, a Fresnel zone plate or a grating lens having a one-dimensional or two-dimensional lens function. Light beams are projected onto the alignment patterns 1a and 1b from the left side, and light beams issued from the alignment patterns 1a and 1b travel in the rightward direction after passing through the alignment patterns 2a and 2b, respectively.

First and second detection units 3 and 4 for detecting the first and second signal light beams B1 and B2, respectively, issued from the alignment patterns 1a and 2a, and 1b and 2b are provided facing these patterns. For the convenience of explanation, it is assumed that optical distances between the detection units 3 and 4, and the wafer 2 have the same value L. The interval between the mask 1 and the wafer 2 is represented by $\delta$, the focal lengths of the alignment patterns 1a and 1b are represented by fa1 and fa2, respectively, the relative positional deviation between the mask 1 and the wafer 2 is represented by $\epsilon$, and the displacement of the centers of gravity of the first and second signal light beams B1 and B2 from coincident states on the detection units 3 and 4 are represented by S1 and S2, respectively. For the sake of convenience, it is assumed that alignment light beams incident upon the mask 1 comprise plane waves.

The displacements S1 and S2 of the centers of gravity of the signal light beams B1 and B2 are geometrically obtained as points of intersection of straight lines connecting focal positions F1 and F2 of the alignment patterns 1a and 1b and the centers of the optical axes of the alignment patterns 1a and 1b, and the light-receiving surfaces of the detection units 3 and 4, respectively. In order to shift the displacements S1 and S2 of the respective signal light beams B1 and B2 in opposite directions when there is relative positional deviation between the mask 1 and the wafer 2, the signs of optical image magnifications of the alignment patterns 1a and 1b must be opposite each other. Quantitatively, the displacements S1 and S2 are expressed by:

$$S1 = -\{(L - fa1 + \delta)/(fa1 - \delta)\} \cdot \epsilon$$

$$S2 = -\{(L - fa2 + \delta)/(fa2 - \delta)\} \cdot \epsilon,$$

and deviation magnifications can be defined as $\beta 1 = S1/\epsilon$ and $\beta 2 = S2/\epsilon$.

Accordingly, in order to make the signs of the deviation magnifications opposite to each other, the following condition must be satisfied:

$$(L - fa1 + \delta)(fa2 - \delta)/\{(L - fa2 + \delta)(fa1 - \delta)\} < 0.$$

Practically, the following requirements should be satisfied:

$$L >> |fa1|$$

$$fa1/fa2 < 0$$

$|f_{a1}| > \delta$ $|f_{a2}| > \delta.$

That is, the distance L between the wafer 2 and the detection units 3 and 4 must be much greater and the interval δ between the mask 1 and the wafer 2 must be smaller than the focal lengths fa1 and fa2 of the alignment patterns 1a and 1b, and one of the alignment patterns 1a and 1b must comprise a convex lens and the other must comprise a concave lens.

In the upper portion of FIG. 1, the incident light beam is made to be a focused light beam by the alignment pattern 1a. The focused light beam is projected onto the alignment pattern 2a before reaching its focus point F1 and is imaged onto the first detection unit 3. The focal length fb1 of the alignment pattern 2a in this case is defined so as to satisfy the following lens expression:

$$1/(f_{a1} - \delta) + 1/L = -1/f_{b1}.$$

On the other hand, in the lower portion of FIG. 1, the incident light beam is made to be a light beam diverging from a point F2 situated at the incident side by the alignment pattern 1b. The divergent light beam is imaged onto the second detection unit 4 by the alignment pattern 2b. The focal length fb of the alignment pattern 2b is defined so as to satisfy the following expression:

$$1/(f_{a2} - \delta) + 1/L = -1/f_{b2}.$$

According to the above-described requirements, the magnification of the image focused by the alignment patterns 1a and 2a has a positive value, as is apparent from FIG. 1, the directions of the deviation ε of the wafer 2 and the displacement S1 of the focused point on the detection unit 3 are opposite to each other, and the above-defined deviation magnification β1 has a negative value. On the other hand, the magnification of the alignment pattern 2b for the point image (virtual image) made by the alignment pattern 1b has a negative value, the directions of the deviation ε of the wafer 2 and the displacement S2 of the focused point on the detection unit 4 are the same, and the deviation magnification β2 has a positive value. Accordingly, for when there is a relative deviation ε between the mask 1 and the wafer 2, the directions in which the displacements S1 and S2 shift are opposite to each other.

Figure 2:
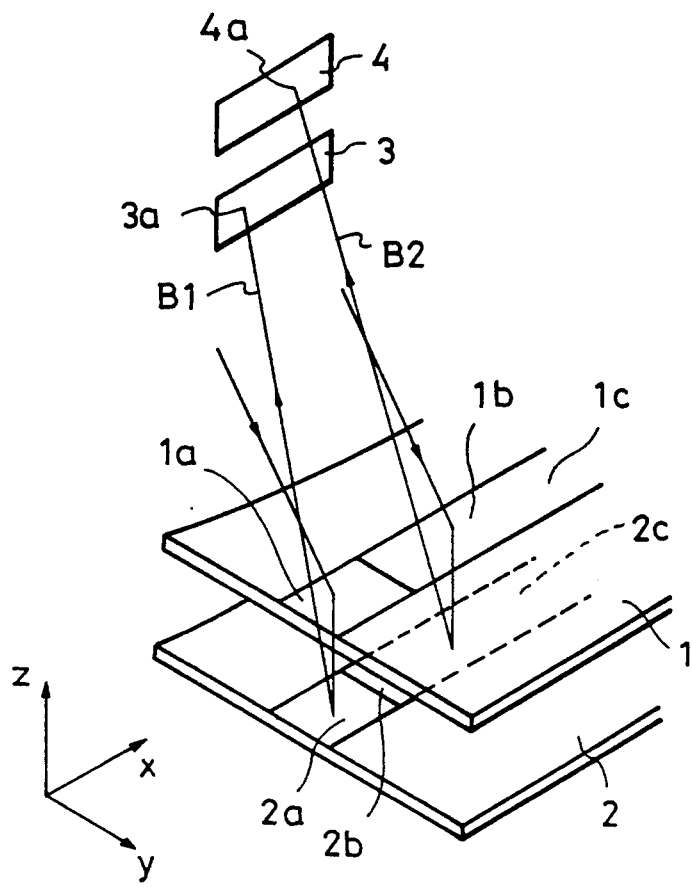
FIG. 2 is a diagram showing the arrangement of a system for detecting deviation of alignment according to the present invention.

FIG. 2 is a diagram showing the arrangement of a system for detecting positional deviation in the present embodiment. In FIG. 2, the same components as those shown in FIG. 1 are indicated by the same reference numerals. FIG. 2 schematically illustrates the relationship between the amount of deviation between the mask 1 and the wafer 2, and the difference between output signals from the detection units 3 and 4, that is, the interval between incident positions of the signal light beams B1 and B2 on the detection unit 3 and 4 in the x direction, which is the direction of auto-alignment. The alignment patterns 1a and 1b, and 2a and 2b are provided on scribing lines 1c and 2c provided on the surfaces of the mask 1 and the wafer 2, respectively.

Figure 3:
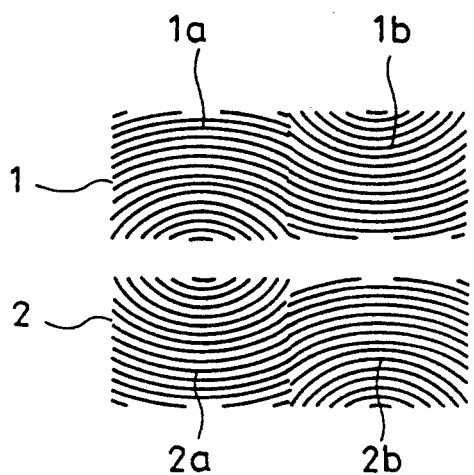
FIG. 3 is a plan view of alignment patterns.

As shown in FIG. 3, the alignment patterns 1a, 1b, 2a and 2b comprise Fresnel zone plates or grating lenses having different focal lengths. Practically, appropriate dimensions of these patterns 1a, 1b, 2a, and 2b are 50-300 μm in the direction of the scribing lines 1c and 2c (the x direction), and 20-100 μm in the direction of the widths of the scribing lines 1c and 2c (the y direction). The focal lengths of the respective patterns are set so as to satisfy the above-described expressions.

The first and second signal light beams B1 and B2 are emitted from a light source provided within a pickup box, and are collimated to a predetermined beam size. A light source which emits a coherent light beam, such as a semiconductor laser, a He-Ne laser, an Ar laser or the like, or a light source which emits an incoherent light beam, such as a light-emitting diode or the like, is, for example, used as the light source. Each of the detection units 3 and 4 for receiving the first and second signal light beams, respectively, comprises a one-dimensional CCD (charge-coupled device).

In the present embodiment, the signal light beams B1 and B2 are transmitted and diffracted after being incident upon the alignment patterns 1a and 1b on the mask 1 at a predetermined angle, reflected and diffracted by the alignment patterns 2a and 2b on the wafer 2, and are incident upon positions 3a and 4a on the detection units 3 and 4 after passing through the mask 1, respectively. The detection units 3 and 4 detect the positions of the centers of gravity of the signal light beams B1 and B2 incident upon the surfaces of the detection units 3 and 4, respectively. The positional deviation between the patterns 1a and 1b on the mask 1 and the patterns 2a and 2b on the wafer 2 is detected using output signals from the detection units 3 and 4.

In order to determine output signals from the detection units 3 and 4 which correspond to the amount of deviation 0, the state of 0 deviation between the mask 1 and the wafer 2 may be confirmed, for example, by evaluating the state during actual printing.

Figure 4:
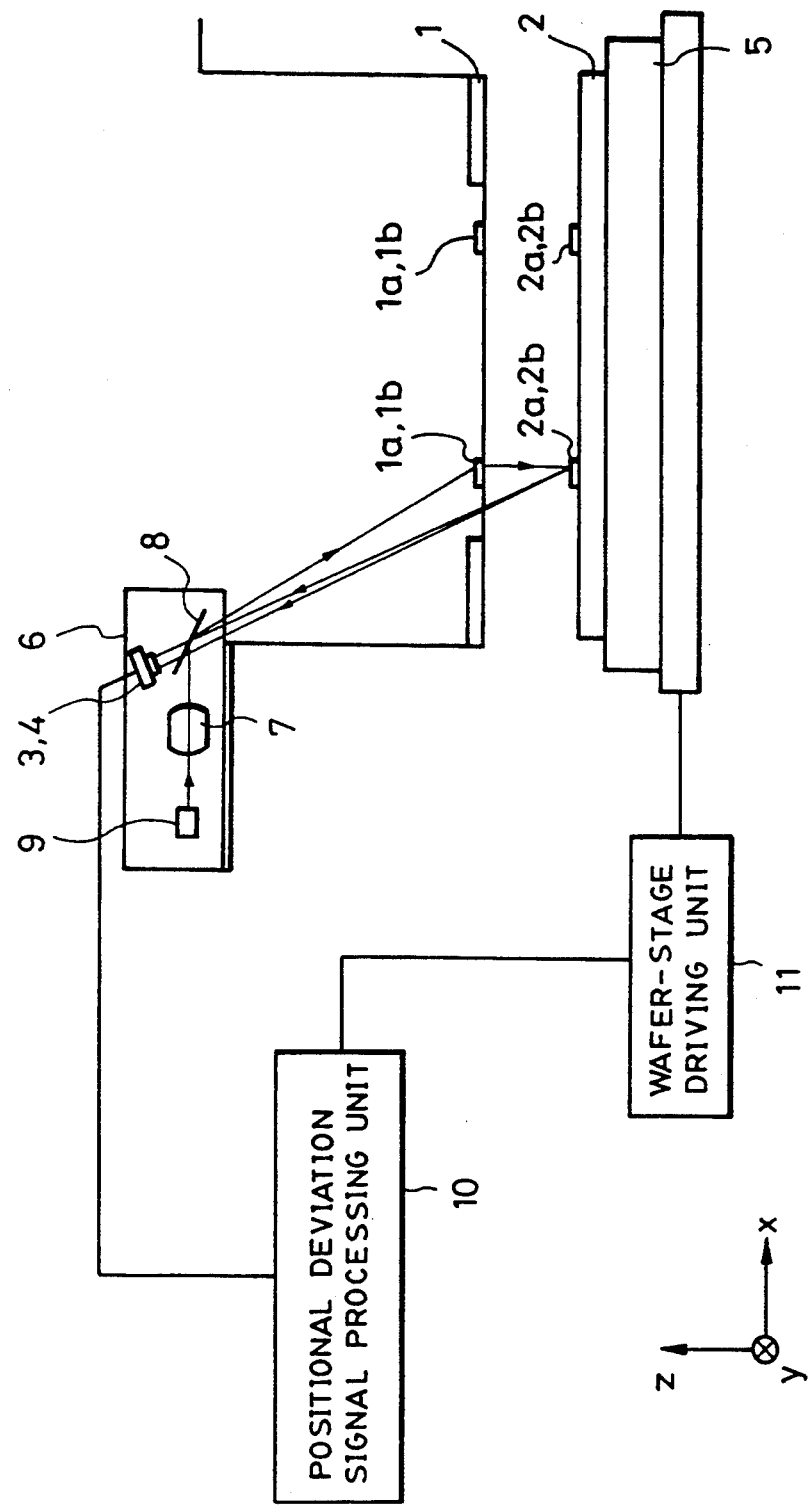
FIG. 4 is a diagram showing the configuration of the present invention when the method of detecting deviation is applied to a semiconductor exposure apparatus.

FIG. 4 is a diagram showing the schematic configuration of a proximity-type semiconductor exposure apparatus which uses the above-described system for detecting positional deviation. In FIG. 4, the wafer 2 is mounted on a wafer stage 5. A pickup box 6 is disposed obliquely above the mask 1, and incorporates a light source 9 for projecting first and second signal light beams B1 and B2 onto the mask 1 and the wafer 2, respectively, via a collimating lens (or a beam-size conversion lens) 7 and a projected-light-beam deflecting mirror 8, and light reflected from the mask 1 and the wafer 2 is detected by the detection units 3 and 4. Outputs from the detection units 3 and 4 are input into a positional-deviation-signal processing unit 10 connected thereto, whose output controls a wafer-stage driving unit 11 to move the wafer stage 5.

Detection of the amount of relative positional deviation between the mask 1 and the wafer 2 is performed as explained above. To detect a deviation ε between the mask 1 and the wafer 2, the distance over which the incident positions of the light beams B1 and B2 move on the detection units 3 and 4 can be set to a high magnification of 100ε-500ε. Suppose, for example, that the magnification of the movement of the incident positions of the light beams B1 and B2 on the detection units 3 and 4 when there is a deviation between the mask 1 and the wafer 2, is selected to be 500. In such a case, if the amount of movement of 1 μm is detected by the detection units 3 and 4, a deviation ε between the mask 1 and the wafer 2 of 1/500 = 0.002 μm can be detected. Hence, alignment deviation can be highly precisely detected.

Figure 5:
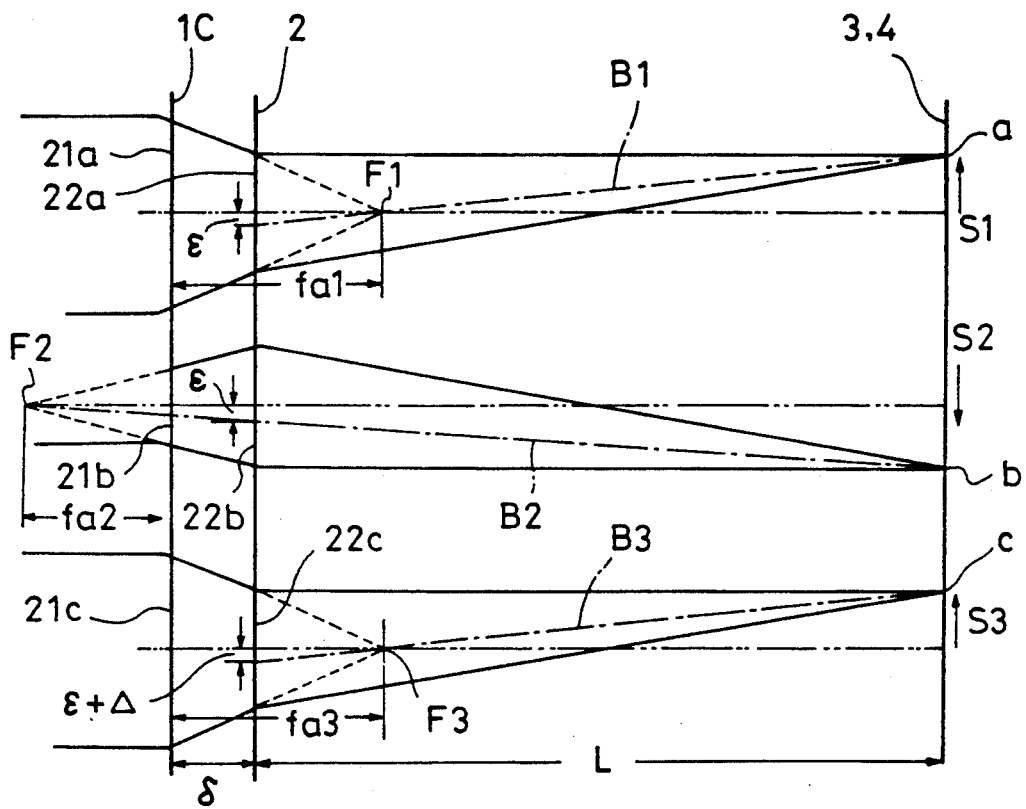
FIG. 5 is a diagram illustrating the principle of detection in an exposure apparatus.

Next, an explanation will be provided of an apparatus which uses the method of the first embodiment for measuring alignment accuracy in an exposure apparatus utilizing the above-described alignment detection function. FIG. 5 is a diagram illustrating the principle of such an apparatus. In FIG. 5, the same components as those shown in FIG. 1 are indicated by the same reference numerals. In FIG. 5, there is shown a mask 1C for inspection. The following expressions hold for respective parameters shown in FIG. 5:

$$S1 = (L + \delta - fa1) \cdot \epsilon/(fa1 - \delta)$$
$$S2 = (L + \delta - fa2) \cdot /(fa2 - \delta) \quad (1)$$
$$S3 = (L + \delta - fa3) \cdot (\epsilon + \Delta)/(fa3 - \delta),$$

where $\Delta$ represents the value of a parameter to be inspected, such as the amount of an alignment error, fa1, fa2 and fa3 represent the focal lengths of patterns 21a, 21b and 21c, respectively, and S1, S2 and S3 represent displacements of the positions of the centers of gravity of signal light beams B1, B2 and B3 when $\epsilon=0$ and $\Delta=0$. F3 is the focus point of pattern 21c.

For the purpose of briefly explaining printing processes of a semiconductor device, FIGS. 6(a)-6(d) illustrate plan views of the states of patterns on a scribing line on the wafer 2 as a result of printing on a first layer and a second layer formed on the first layer, and the states of autoalignment patterns and patterns for inspecting deviation provided on the masks 1A and 1B. In FIGS. 6(a)-6(d), only patterns formed at one side of one shot of an integrated circuit pattern are shown, and patterns formed at the other three sides are omitted.

In FIGS. 6(a)-6(d), the same reference numerals as those shown in FIG. 5 indicates the same components or configurations. FIGS. 6(a)-6(d) show the patterns provided on the wafer 2, and the patterns provided on the masks 1A and 1B which are printed on the first and second layers of the wafer 2.

Figure 6A:
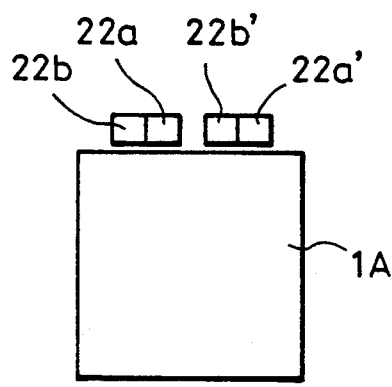
FIGS. 6(a)–6(d) are diagrams illustrating processes for printing on semiconductor devices.

FIG. 6(a) shows patterns provided on the mask 1A which are to be printed on the first layer. Reference numerals 22a' and 22b' represent alignment patterns for aligning the second layer to be printed on the first layer on the wafer 2, and correspond to the alignment patterns 2a and 2b shown in FIG. 1. Reference numerals 22a and 22b represent patterns for inspecting deviation of the first layer to be printed on the wafer 2 after aligning the wafer 2 with the mask 1A. A pattern used when aligning the wafer 2 with the mask 1 during exposure will be termed an "autoalignment pattern", and a pattern provided on the wafer 2 after the exposure for inspecting the deviation between two layers in printing will be termed an "autoalignment inspection pattern". In FIG. 6(a), the patterns 22a' and 22b' are autoalignment patterns on the mask 1, and the patterns 22a and 22b are autoalignment inspection patterns.

Figure 6B:
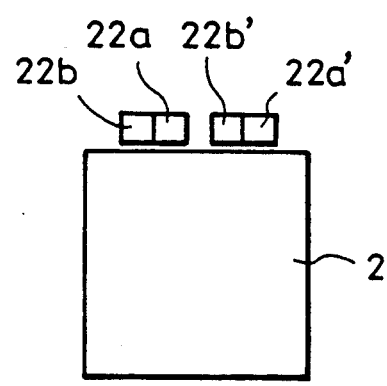
Figure 6C:
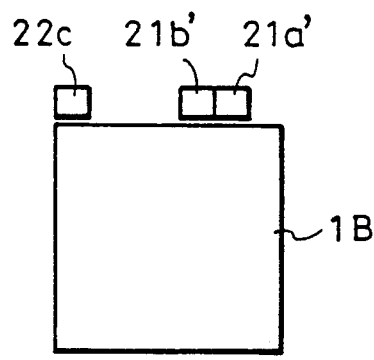
Figure 6D:
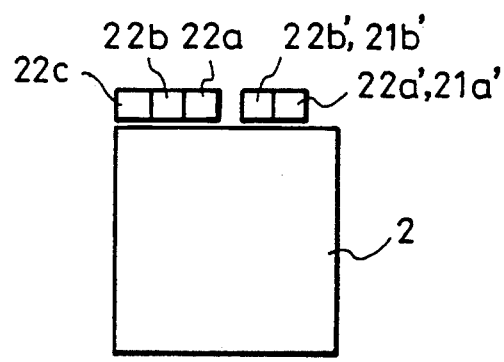

FIG. 6(b) shows the first layer on which the patterns shown in FIG. 6(a) have been printed. As in the case of FIG. 6(a), the patterns 22a' and 22b' are autoalignment patterns (corresponding to patterns 2a and 2b shown in FIG. 2), and the patterns 22a and 22b are autoalignment inspection patterns. These patterns have been printed from the mask 1A. FIG. 6(c) shows patterns provided on the mask 1B to be printed on the second layer. In FIG. 6(c), reference numerals 21a' and 21b' represent autoalignment patterns (corresponding to the patterns 1a and 1b shown in FIG. 2), and reference numeral 22c represents an autoalignment inspection pattern. FIG. 6(d) illustrates the state when the patterns shown in FIG. 6(c) have been printed on the second layer. In FIG. 6(d), the patterns 21a', 22a', 22b' and 21b' are autoalignment patterns, and the patterns 22a, 22b and 22c are autoalignment inspection patterns. Printing is performed after aligning the mask 1B with the wafer 2 according to the above-described method of detecting positional deviation using the autoalignment patterns 21a' and 21b' on the mask 1B and the autoalignment patterns 22a' and 22b' on the wafer 2 (corresponding to the patterns 1a, 1b, 2a and 2b shown in FIG. 2).

That is, information on positional deviation between printed patterns on the first and second layers is included in the autoalignment inspection patterns 22a, 22b and 22c on the wafer 2 after printing on the second layer. These patterns correspond to reference numerals 22a, 22b and 22c shown in FIG. 5 illustrating the principle of the present invention.

Referring again to FIG. 5, reference numerals 22a and 21a represent physicooptical elements having the diffraction functions of a convex lens and a concave lens, respectively, reference numerals 21b and 22b represent physicooptical elements having the diffraction functions of a concave lens and a convex lens, respectively, and reference numerals 21c and 22c represent physicooptical elements having the diffraction functions of a convex lens and a concave lens, respectively. The patterns 22a, 22b and 22c shown in FIG. 6(d) correspond to the physicooptical elements 22a, 22b and 22c shown in FIG. 5, respectively.

Accordingly, after performing printing by the semiconductor printing apparatus, deviation of the patterns in printing can be detected by subjecting the wafer 2 to semiconductor production processes, that is, so-called autoalignment inspection can be performed. Such an operation will be explained with reference to FIGS. 7 through 9.

FIG. 7 is a diagram showing the configuration of the apparatus of the present embodiment. In FIG. 7, components indicated by the same reference numerals as those indicated in FIGS. 2 and 4 are different components having the same functions as those in FIGS. 2 and 4. However, the signal processing unit 10, the wafer-stage driving unit 11 and the wafer stage 5 comprise the same components as those shown in FIGS. 2 and 4. A box 30 movable relative to the wafer 2, in which an alignment optical system and a mask 1C for inspection are provided as one body, is provided above the wafer 2, serving as an object to be inspected. The apparatus shown in FIG. 7 is the same exposure apparatus as shown in FIG. 4 except that the box 30 is provided, and therefore it functions as an exposure apparatus.

In the exposure apparatus shown in FIG. 4, light beams from the light source 9 are incident upon the patterns 1a and 1b on the mask 1, light beams from the respective patterns are incident upon the patterns 2a and 2b on the wafer 2, and light beams from the patterns 2a and 2b form spots on the detection units 3 and 4. On the other hand, in the apparatus shown in FIG. 7, light beams from the light source 9 are incident upon the three patterns 21a, 21b and 21c formed on the mask 1C for alignment inspection, light beams from the respective patterns are incident upon the three patterns 22a, 22b and 22c for inspection on the wafer 2, and light beams from the respective patterns on the wafer 2 form three diffraction spots on the detection units 3 and 4. Signals representing deviation in printing between printed patterns, that is, between patterns on the first and second layers, on the wafer 2 can be obtained from the distance between the diffraction spots formed on the detection units 3 and 4.

Figure 8:
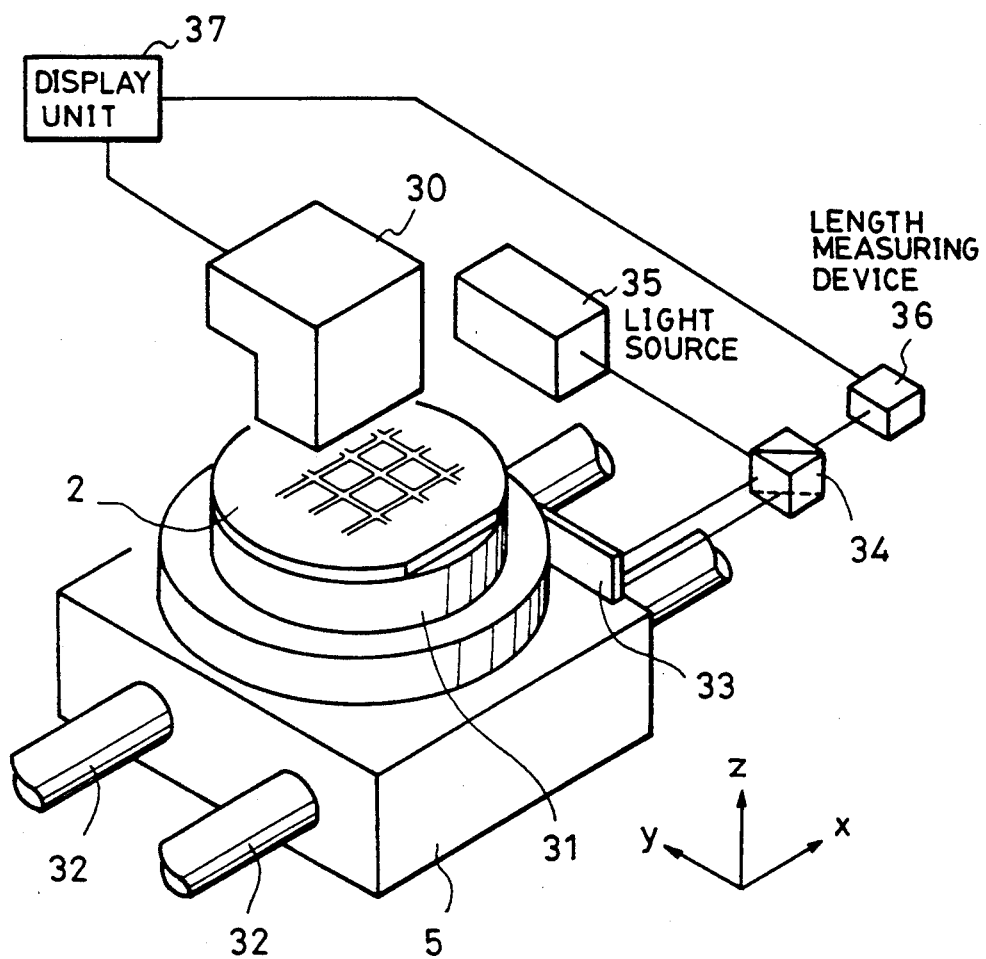
FIG. 8 is a perspective view of the exposure apparatus.

FIG. 8 is a perspective view of the apparatus of the present embodiment. In FIG. 8, the wafer 2 is held by suction on a wafer chuck 31, and is mounted on the wafer stage 5 movable along a guide 32 in one axial direction. Although a moving mechanism in the y-axis direction is omitted in the figure, in order to move the wafer 2 in the y-axis direction, a stage movable in the y-axis direction and a length measuring device for measuring the distance of movement of the stage in the y-axis direction may be provided below the stage 5. In order to measure the moving distance, a reflecting mirror 33 is mounted on the stage 5, a light beam from a light source 35 for length measurement is projected onto the mirror 33 via a prism 34, the light beam reflected by the mirror 33 is incident upon a length measuring device 36, comprising an interferometer, via the prism 34, and the output of the length measuring device 36 is displayed on a display unit 37 as the amount of movement of the stage 5 in the x-axis direction. Display unit 37 is connected to a box 30, movable relative to the wafer 2, in which an alignment optical system and a mask 1C for inspection are provided as one body.

Figure 9:
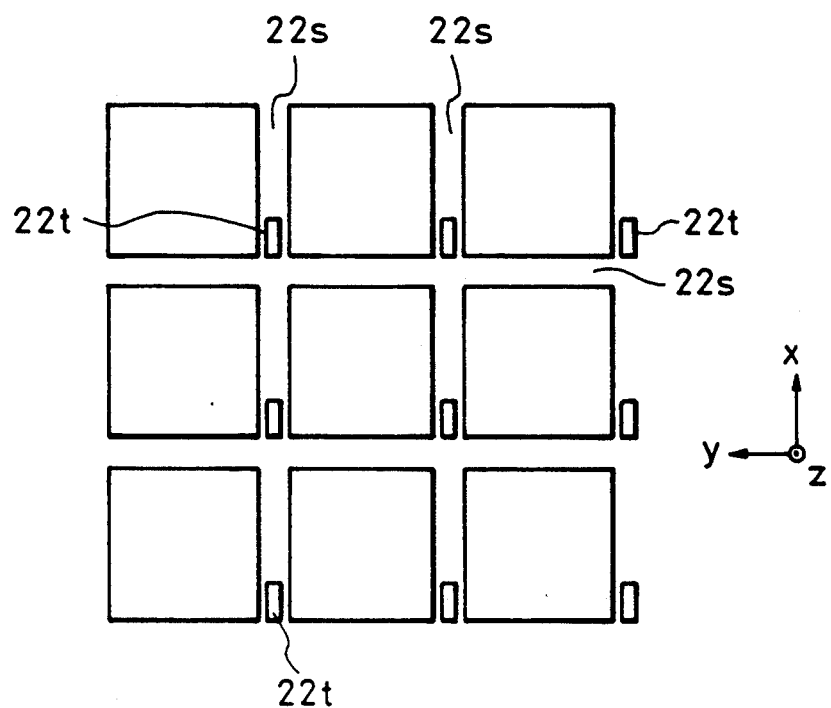
FIG. 9 is a plan view of patterns on a wafer.

FIG. 9 illustrates the state of the patterns on the wafer 2 shown in FIG. 8. In FIG. 9, there are shown so-called scribing lines 22s, and autoalignment inspection patterns 22t printed on the scribing lines 22s. That is, the state of the patterns shown in FIG. 9 corresponds to the provision of the patterns 22a, 22b and 22c in FIG. 7.

Figure 10:
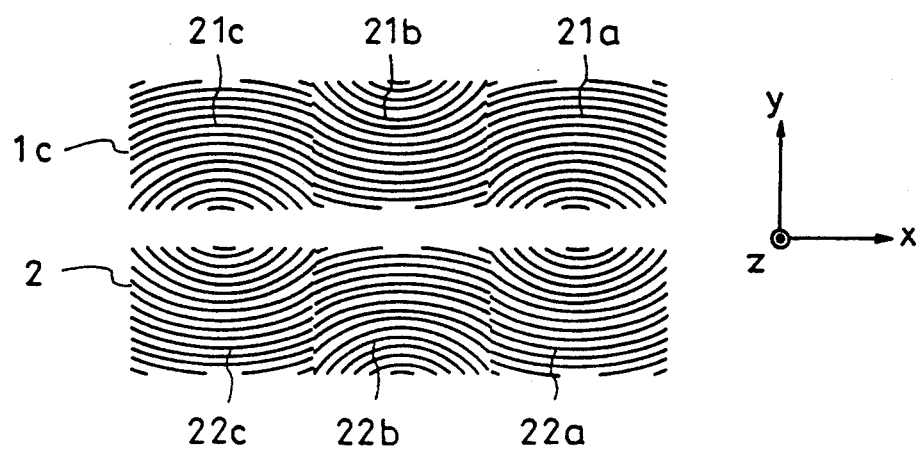
FIG. 10 is a plan view of patterns on a mask and a wafer.

FIG. 10 illustrates the inspection patterns 21a, 21b and 21c provided on the mask 1C for inspection, and the autoalignment inspection patterns printed on the wafer 2 in autoalignment inspection shown in FIG. 7. In FIGS. 10 and 7, the patterns 21a and 22a, 21b and 22b, and 21c and 22c form spots "a", "b" and "c" on the detection units 3 and 4, respectively. In order to align the mask 1c for inspection with the wafer 2 using the above-described principle of the detection of positional deviation, the wafer 2 is moved by moving the stage 5 so that the amount of deviation between the mask 1c and the wafer 2 is 0, that is, $\epsilon = 0$ in expression (1), while watching the distance between the spots "a" and "b" on the detection unit 3 and 4 (in this case, both S1 and S2 become 0). Subsequently, the interval between the spots "b" and "c" or spots "a" and "c" is detected by the detection units 3 and 4 in order to determine the amount of deviation in autoalignment from the value 0, that is, the amount of deviation of the actual spot interval from the ideal spot interval between the spots "b" and "c" or the spots "a" and "c" if no error is produced in the alignment process. This amount of deviation corresponds to S3 since S1=S2=0. From this amount, the value of a parameter to be inspected, for example, the amount $\Delta$ of the alignment error is calculated according to expression (1) (assuming that other parameters have been obtained). In FIG. 10, deviation in the x-axis direction is the direction of alignment inspection.

The ideal spot interval at that time, that is, the interval between the spots "a" and "c" or the spots "b" and "c" when the alignment inspection patterns 22a, 22b and 22c are formed in a state of being not deviated from one another is obtained in the following way. First, a sample wafer in which the amount of pattern deviation between the first and second layers is close to 0 with a high accuracy is prepared. Next, the interval between the spots "a" and "c" or the spots "b" and "c" is obtained by performing the above-described measurement by the apparatus of the present embodiment. This interval is used as the ideal spot interval for the subsequent measurement.

Figure 11:
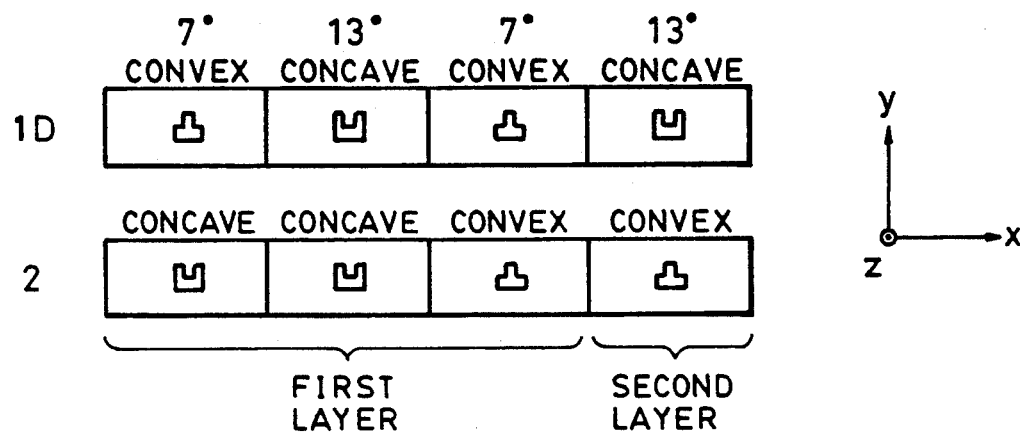
FIG. 11 is a diagram illustrating the arrangement of concave and convex lenses on the mask and the wafer.
Figure 12:
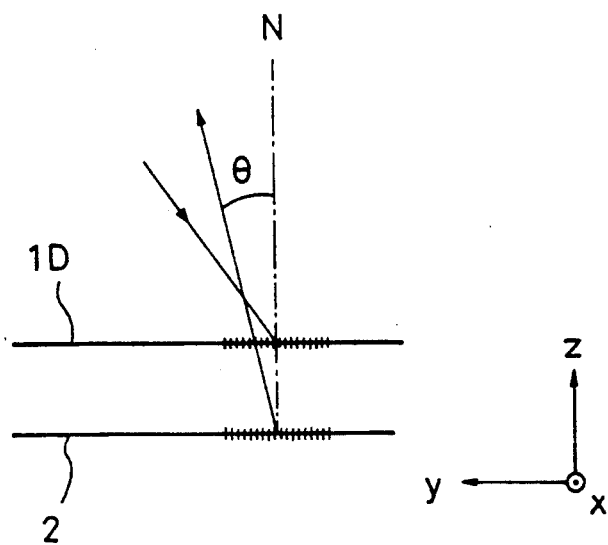
FIG. 12 is a diagram illustrating diffraction.

FIG. 11 shows an example of patterns on a mask 1D for inspection and a wafer 2 in another embodiment of the present invention, and illustrates the arrangement of convex-lens diffraction functions and concave-lens diffraction functions of the patterns on the mask 1D and the wafer 2. In FIG. 11, the arrangement of patterns to be printed on the first and second layers on the wafer 2 is shown in the lower portion thereof, and the indicated angles 7° and 13° are outgoing angles of light beams reflected by the wafer 2 with respect to a normal N of mask 1D for the respective pattern combinations. That is, as shown in FIG. 12, a light beam travelling toward a detection unit (not shown) after being subjected to primary diffraction by the mask 1D and primary diffraction by the wafer 2 makes two kinds of angles, i.e., 7° and 13°, with the normal N of the mask 1D. Thus, a light beam subjected to primary diffraction by a convex pattern of the mask 1D and primary diffraction by a concave pattern of the wafer 2 will make a 7° angle with respect to the normal N. A light beam subjected to primary diffraction by a concave pattern of the mask 1D and primary diffraction by a concave pattern on the mask 2 will make a 13° angle with respect to the normal N. A light beam subjected to primary diffraction by a convex pattern of the mask 1D and primary diffraction by a convex pattern on the mask 2 will make a 7° angle with respect to the normal N. A light beam subjected to primary diffraction by a concave pattern in the mask 1D and primary diffraction by a convex pattern on the mask 2 will make a 13° angle with respect to the normal N. The detection units 3 and 4 comprise line sensors, and are disposed at positions where diffracted spot light beams having the angles 7° and 13° are received.

Figure 13A:
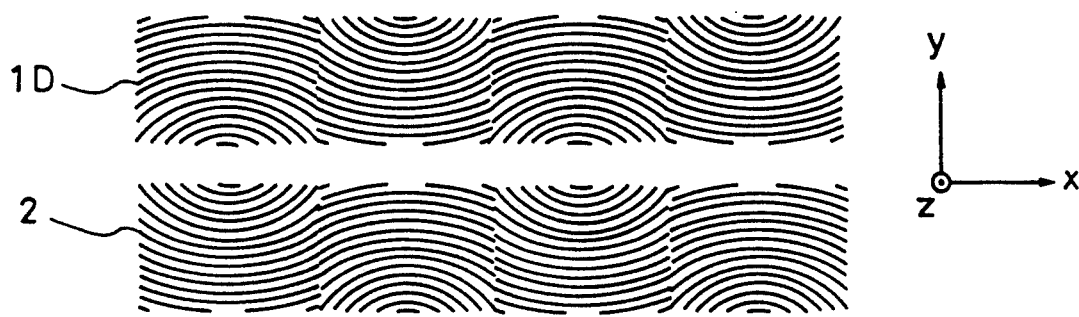
FIGS. 13(a) and 13(b) are diagrams illustrating a combination of mask patterns and wafer patterns.
Figure 13B:
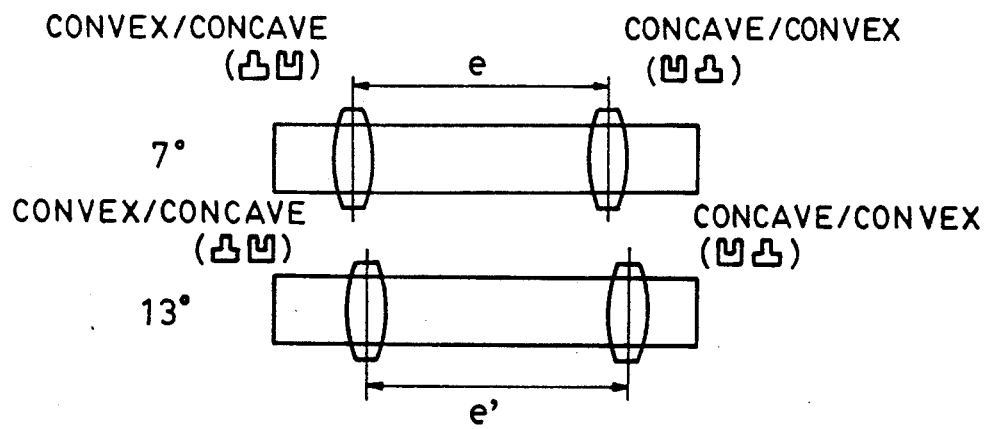

FIG. 13(a) is a diagram illustrating each combination of a mask pattern and a wafer pattern. Each combination, made of upper and lower patterns, forms the above-described spot light beams. FIG. 13(b) illustrates specific relationships between spot light beams formed by the respective patterns shown in FIG. 13(a). In FIG. 13(b), a line sensor disposed at a position to receive a diffracted light beam having the angle $\theta = 7°$ is shown at the upper portion, and a line sensor disposed at a position to receive a diffracted light beam having the angle $\theta = 13°$ is shown at the lower portion. The notation "concave/convex (  )" represents a diffracted spot light beam obtained by the combination of a pattern on the mask 1 having a convex-lens function and a pattern on the wafer 2 having a concave-lens function. Similarly, "convex/concave (  )" represents a diffracted spot light beam obtained by the combination of a pattern on the mask 1 having a concave-lens function and a pattern on the wafer 2 having a convex-lens function. While the interval e between the spot light beams on the upper line sensor is constant irrespective of alignment accuracy, the interval e' between the spot light beams on the lower line sensor changes in accordance with the amount $\Delta$ of the alignment error. Accordingly, the amount of deviation between patterns printed on the first and second layers can be detected from the value (e'−e) shown in FIG. 13(b). The value of (e'−e) when the amount of deviation between patterns printed on the first and second layers is 0 is obtained by previously preparing a sample wafer in which the amount of deviation between patterns on the first and second layers is 0 and measuring the value of (e'−e) by the apparatus of the present embodiment.

Figure 14:
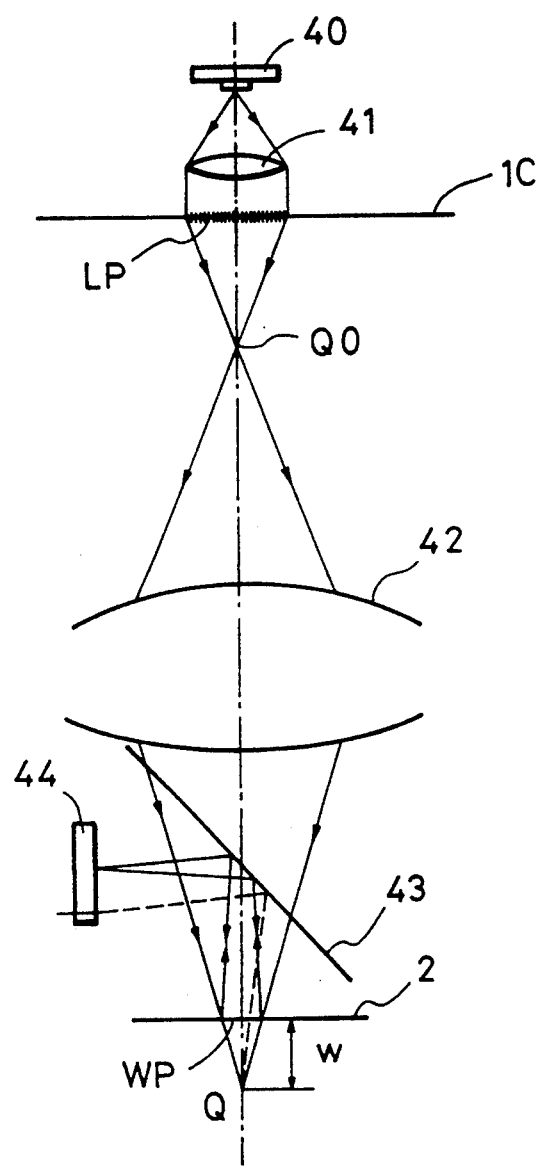
FIG. 14 is a diagram showing the configuration of deviation detection in another embodiment of the present invention.

As shown in FIG. 14, the present invention can also be applied to a case in which corresponding components located at the side of the mask 1C opposite from the wafer 2 in a detection system are not close to the wafer 2 to be evaluated. In the present embodiment, a light beam emitted from a light source 40 is made to be parallel light beam by a projection lens 41 to illuminate patterns LP on a surface L of the mask 1C. In FIG. 14, the patterns LP comprise physicooptical elements, such as transparent zone plates having a lens function of focusing transmitted light onto a point Q0, or the like. The light beam from the point Q0 is focused onto a point Q spaced from the wafer 2 by a distance w by means of a lens system 42. Patterns WP are provided on the wafer 2. The patterns WP comprise physicooptical elements, such as reflective zone plates or the like, and function so as to reflect an incident light beam to be focused onto the point Q and image the light beam onto a detection unit 44 via a half-mirror 43.

Means for detecting deviation in printing by detecting the amount of deviation of the center of gravity of the light beam guided to the detection unit 44 has the same configuration as shown in FIGS. 10, 13(a) and 13(b). The patterns on the mask 1C shown in FIG. 10 or the patterns on the mask 1D shown in FIG. 13(a) may be used as the patterns LP, and the patterns printed on the wafer 2 shown in FIGS. 10 or 13(a) may be used as the patterns WP.

As explained above, according to the method for measuring deviation of the present invention and the apparatus which uses such a method, it is possible to perform exact measurement of deviation between patterns in superposed printing.

The individual components represented by the blocks shown in FIGS. 4, 7 and 8 are well-known in the deviation measuring apparatus art and their specific construction and operation is not critical to the invention or the best mode for carrying out the invention. Moreover, the steps recited in the specification for carrying out the present invention can be easily programmed into well-known central processing units by persons of ordinary skill in the art and since such programming per se is not part of the invention, no further description thereof is deemed necessary.

What is claimed is:

1. A method for measuring the deviation between elements on an object, comprising the steps of:
   forming at least a first physicooptical element on the object;
   forming at least a second physicooptical element on the object, said first and second physicooptical elements having lens functions;
   projecting light beams onto the first and second physicooptical elements on the object, and detecting the incident positions of two light beams, travelling from the first and second physicooptical elements and having been subjected to the lens functions of the first and second physicooptical elements on a predetermined surface; and
   detecting the deviation between the first and second physicooptical elements on the object from the relationship between the detected incident positions of two light beams.

2. A method according to claim 1, wherein said first physicooptical element forming step comprises the step of forming a first alignment mark on the object together with the first physicooptical element, and wherein said second physicooptical forming step is performed after positional adjustment is performed using the first alignment mark.

3. A method according to claim 2, further comprising the step of detecting a state of positional adjustment of the object by detecting the deviation between the physicooptical elements in said deviation detection step.

4. A method according to claim 1, wherein said first physicooptical element forming step comprises the step of forming first and third alignment marks together with the first physicooptical element,
   wherein said second physicooptical element forming step is performed after preparing a member for forming the second physicooptical element having a second alignment mark thereon, and
   wherein said second physicooptical element forming step comprises the step of performing positional adjustment of the object using the first and second alignment marks, and
   wherein said method further comprises the steps of:
   after preparing a substrate having a fourth alignment mark and third and fourth physicooptical elements, and performing positional adjustment between the object and the substrate using the third and fourth alignment marks, illuminating the first and second physicooptical elements with first and second light beams deflected by the third and fourth physicooptical elements; and
   detecting incident positions of light beams travelling from the first and second physicooptical elements while being deflected by the respective elements on a predetermined surface.

5. A method according to claim 4, further comprising the step of detecting the state of the positional adjustment between the object and the member by detecting the deviation between the physicooptical elements in said deviation detecting step.

6. A method according to claim 1, wherein at least one of said forming steps comprises the step of forming a physicooptical element comprising a Fresnel zone plate.

7. An apparatus for measuring deviation between elements on an object, comprising:
   irradiation means for irradiating an object with light beams, said irradiation means irradiating first and second physicooptical elements formed on the object with the light beams, the first and second physicooptical elements having lens functions;
   detection means for detecting incident positions of two light beams travelling from the first and second physicooptical elements, having been subjected to the lens functions of the first and second physicooptical elements, on a light-receiving surface; and
   measurement means for measuring the deviation between the first and second physicooptical elements on the object from the relationship between the detected incident positions of the two light beams.

8. An exposure apparatus, comprising:
   first holding means for holding an exposure original;
   second holding means for holding an object to which the exposure original is exposed and from which a pattern is transferred;
   irradiation means for irradiating the object held by said second holding means with light beams, said irradiation means irradiating first and second physicooptical elements formed on the object with the light beams, the first and second physicooptical elements having lens functions;

detection means for detecting incident positions of two light beams travelling from the first and second physicooptical elements, having been subjected to the lens functions of the first and second physicooptical elements, on a light-receiving surface; and measurement means for measuring the deviation between the first and second physicooptical elements on the object from the relationship between the detected incident positions of the two light beams.

* * * * *

UNITED STATES PATENT AND TRADEMARK OFFICE
CERTIFICATE OF CORRECTION

PATENT NO. : 5,313,272
DATED : May 17, 1994
INVENTOR(S) : NORIYUKI NOSE, ET AL.

It is certified that error appears in the above-indentified patent and that said Letters Patent is hereby corrected as shown below:

COLUMN 1

Line 21, "important" should read --the important--.
    Line 67, "steps:" should read --steps of:--.

COLUMN 7

Line 9, "$(L + \delta - fa2) \cdot /(fa2 - \delta)$" should read --$(L + \delta - fa2)/(fa2 - \delta)$--.
    Line 31, "indicates" should read --indicate--.

COLUMN 11

Line 7, "parallel" should read --a parallel--.

Signed and Sealed this

Twenty-fifth Day of October, 1994

Attest:

BRUCE LEHMAN

*Attesting Officer*       *Commissioner of Patents and Trademarks*